(12) United States Patent
Grudkowski et al.

(10) Patent No.: US 6,300,706 B1
(45) Date of Patent: Oct. 9, 2001

(54) COMPOUND SEMICONDUCTOR MONOLITHIC FREQUENCY SOURCES AND ACTUATORS

(75) Inventors: Thomas W. Grudkowski, Saint Louis, MO (US); Arthur Ballato, Oceanport, NJ (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

(21) Appl. No.: 09/353,544

(22) Filed: Jul. 14, 1999

(51) Int. Cl.[7] .................................................. H01L 41/08
(52) U.S. Cl. .................... 310/334; 310/322; 310/324; 310/313 R; 310/341
(58) Field of Search .................. 310/311, 322, 310/324, 334, 338, 339, 313 R, 341, 316.01, 316.02, 317, 319

(56) References Cited

U.S. PATENT DOCUMENTS

| | | | |
|---|---|---|---|
| 1,875,953 | * 9/1932 | Taylor | 310/341 |
| 4,019,200 | * 4/1977 | Adkins et al. | 310/313 R X |
| 4,233,573 | * 11/1980 | Grudkowski | 310/313 R X |
| 4,841,775 | * 6/1989 | Ikeda et al. | 310/324 X |
| 5,075,641 | * 12/1991 | Weber et al. | 310/324 X |
| 5,200,664 | * 4/1993 | Sugai | 310/313 R |
| 5,406,163 | * 4/1995 | Carson et al. | 310/334 |
| 5,422,533 | * 6/1995 | Kosinski et al. | 310/335 |
| 5,569,968 | * 10/1996 | Lal et al. | 310/334 X |
| 5,721,463 | * 2/1998 | Snyder | 310/341 X |
| 5,789,845 | * 8/1998 | Wadaka et al. | 310/334 |
| 5,910,756 | * 6/1999 | Ella | 310/335 X |
| 5,956,292 | * 9/1999 | Bernstein | 310/334 X |

* cited by examiner

Primary Examiner—Mark O. Budd
(74) Attorney, Agent, or Firm—Michael Zelenka; George B. Tereschuk (57) ABSTRACT

The present invention is a piezoelectric device fabricated on a semiconductor that also contains electronic circuitry. A cooling device is used to lower the temperature of the resonator. Electronic circuitry can provide feedback to the resonator to compensate for microphonics that occur at low temperatures. Alternatively, piezoelectric materials that can operate at high temperatures can create a high temperature frequency source.

53 Claims, 10 Drawing Sheets

COMPOUND SEMICONDUCTOR MONOLITHIC FREQUENCY SOURCES AND ACTUATORS

GOVERNMENT INTEREST

This invention may be manufactured, used, imported, sold and licensed by or for the United States of America without paying any royalties to the inventors.

FIELD OF THE INVENTION

This invention relates to III–V or II–VI (or more generally, compound) semiconductors that have crystal symmetry so as to be piezoelectric (usually 4-bar 3 m or 6 mm). In particular, this invention relates to the monolithic creation of frequency stable resonators and/or mechanical resonant or non-resonant sensors along with electronic circuitry ancillary to the device. The invention may use reduced temperatures to stabilize and improve the operations of the device.

BACKGROUND OF THE INVENTION

Stable frequency sources, such as clocks, are required for numerous electronic applications. For example, microprocessors need a clock in order to function. Currently, a discrete piezoelectric frequency control device, such as a quartz oscillator, provides a stable frequency signal to integrated circuit electronic components. This hybrid combination of a piezoelectric oscillator together with an integrated circuit, is much larger than the integrated circuit by itself. In order to reduce the total size of an electronic device, the piezoelectric frequency source should be fabricated in the semiconductor substrate, to provide a monolithic, integrated acoustic/electronic device that is much smaller than the hybrid combination.

New technology has emerged which does fabricate the piezoelectric source into a semiconductor to form a monolithic acoustic/electronic integrated circuit. However, when operating at room temperature, the conductivity of the semiconductor reduces the quality factor Q, which in turn degrades the performance of the acoustic device. As a result, such monolithic acoustic/electronic devices have not achieved the high performance, low phase noise, or high Q of the discrete quartz oscillators used in the hybrid circuits.

Therefore, a strong need to improve the performance of piezoelectric semiconductor frequency sources exists. This need is met be providing a constant, low temperature environment, along with electronic feedback circuitry to compensate for fluctuations in temperature.

Similarly, at high temperatures, there is a need for a piezoelectric resonator which is able to function at high temperatures.

SUMMARY OF THE INVENTION

The invention includes an article of manufacture comprising an integrated circuit and an acoustic device fabricated in the integrated circuit. In one embodiment, the article of manufacture includes a heat sink for providing a cryogenic temperature to the article. In another embodiment, the invention includes electronic circuitry for providing feedback to the acoustic device. The invention further includes a piezoelectric acoustic device that functions at high temperatures.

DETAILED DESCRIPTION OF THE INVENTION

Piezoelectric Acoustic Devices

Piezoelectric materials convert mechanical energy into electrical signals. These materials are used to create surface acoustic wave and bulk acoustic wave devices, which operate to provide a stable frequency source. They may also be used to create electromechanical sensors and actuators. In order to fabricate these piezoelectric acoustic devices onto integrated circuits, III–V or II–VI semiconductors are used, because III–V and II–VI semiconductors possess either 4-bar 3 m or 6 mm crystal symmetry, which makes them intrinsically piezoelectric. Therefore, surface acoustic wave and/or bulk acoustic wave devices, or electromechanical sensors and actuators and electronic circuitry, can be fabricated from III–V material such as gallium arsenide to form one monolithic, integrated circuit.

Silicon is not piezoelectric, and must have an additional piezoelectric thin film deposited on its surface if it were to be used as a piezoelectric resonator. Gallium arsenide is preferred over silicon, because gallium arsenide is intrinsically piezoelectric. However, at room temperature, the conductivity of gallium arsenide lowers the quality factor Q. Therefore, at room temperatures and above, the performance of the piezoelectric frequency source is adversely affected by temperature-induced electronic conductivity.

Low Temperature Aspects of Piezoelectric Acoustic Devices

Figure 2:
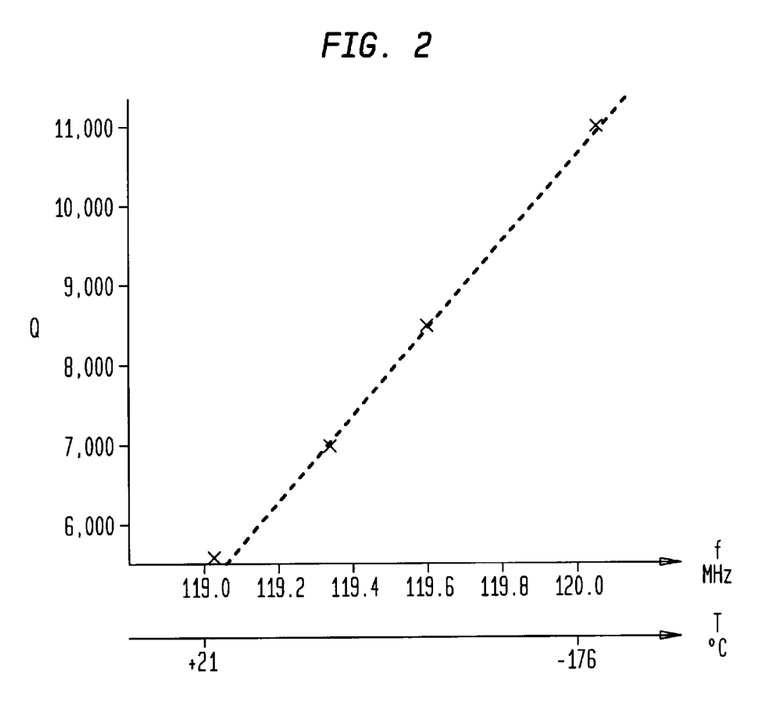
FIG. 2 shows the effects of temperature on Q.
Figure 5A:
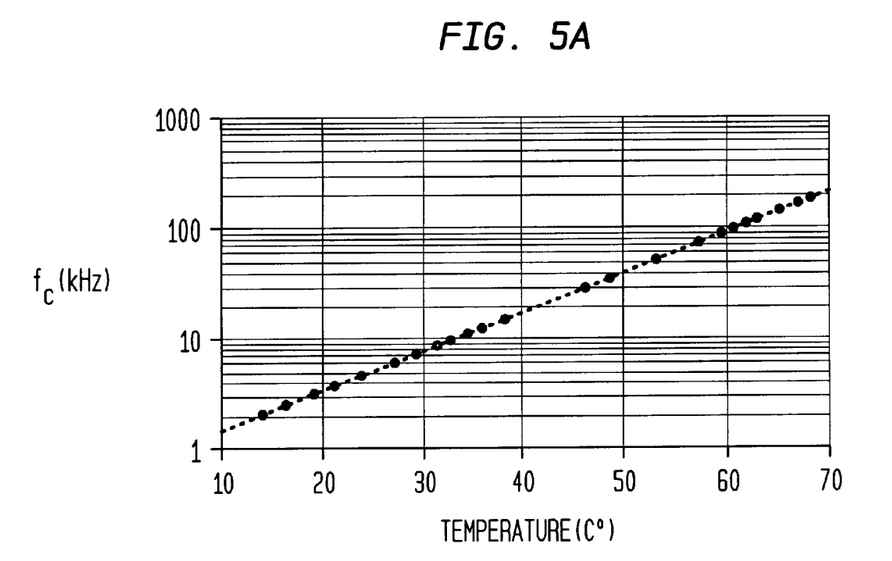
FIGS. 5A & 5B show the measured values of frequency and resistivity of gallium arsenide.
Figure 5B:
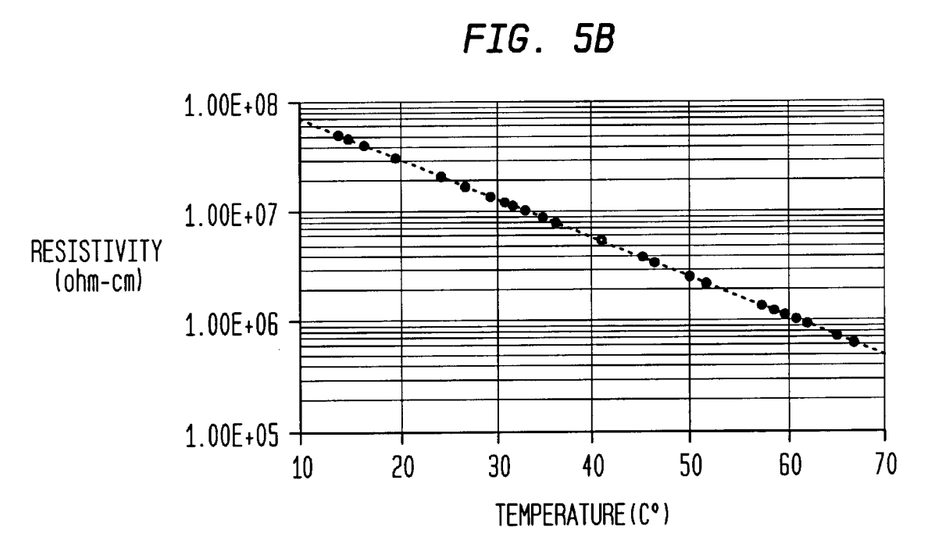

In order to hold the temperature at a low and constant value, a heat sink, such as liquid nitrogen, is used to keep the temperature stable at a cryogenic temperature. Any low temperature heat sink method, such as using cold fingers, or a thermoelectric cooler, may also be appropriate. The heat sink provides a constant temperature bath to the acoustic device. This low temperature sink provides cryogenic temperature stability, which in turn provides the piezoelectric semiconductor frequency source with an increased Q as shown in FIG. 2, higher resistivity as shown in FIG. 5 and Table 1, and lower phase noise than when it operates at room temperature and above.

The entries in Table 1 below have been computed from the formula:

Resistivity (in Ω-cm) equals $\exp(B/T_{abs})$ divided by $A$

Values for the constant 'A' are: $4.3 \times 10^4$ for germanium, $3.4 \times 10^4$ for silicon, and 334.2 for gallium arsenide. Values for the constant 'B' are: 4,350 for germanium, 6,450 for silicon, and 6,759 for gallium arsenide. '$T_{abs}$' is the absolute temperature, i.e., 273.15° plus the temperature, T, in degrees celsius.

TABLE 1

Resistivity for germanium, silicon, and gallium arsenide at room temperature, the freezing point of water, and the temperature of liquid nitrogen

| Temperature, T (° C.) | Resistivity, [Ω-cm] Germanium | Resistivity, [Ω-cm] Silicon | Resistivity, [Ω-cm] gallium arsenide |
|---|---|---|---|
| 25 (room temp.) | 50.5 | $7.3 \times 10^4$ | $2.1 \times 10^7$ |
| 0 (freeze pt.) | 192. | $5.3 \times 10^5$ | $1.7 \times 10^8$ |
| −196 (liquid N) | $7.1 \times 10^{19}$ | $6.0 \times 10^{31}$ | $3.3 \times 10^{35}$ |

Therefore, operating the piezoelectric semiconductor acoustic device at a low temperature provides monolithic stable frequency devices with reduced size and increased performance relative to conventional approaches. These advantages of a low temperature environment are now discussed in detail.

The low temperature operating environment has several advantages. For the microelectronics, the semiconductor properties and ohmic conductivity of gallium arsenide improve at low temperature. Silicon, on the other hand, will reduce its performance at low temperatures, because of electronic carrier freeze-out. This freeze-out in silicon results from the relative shallow energy of dopants in silicon. Gallium arsenide, though, has a large band gap, which prevents carrier freeze-out. Therefore, standard silicon circuitry degrades at cryogenic temperatures, while gallium arsenide improves in performance. Also, the noise figure and the electron mobility μ of the gallium arsenide electronic circuitry are improved at low temperatures.

Figure 1:
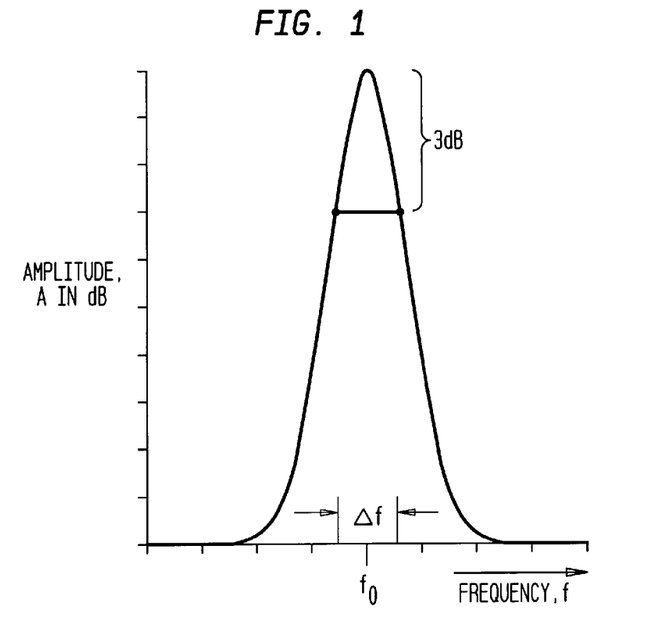
FIG. 1 shows the mechanical quality factor, Q.

The low temperature also improves the acoustic qualities of the piezoelectric resonator. The acoustic properties of the acoustic wave components improve due to lower acoustic losses, thus improving the mechanical quality factor Q. The Q, defined as the ratio of the half-power frequency difference Δf about the resonant frequency $f_0$, given as:

$$Q=f_0/\Delta f$$

is shown in FIG. 1. FIG. 2 shows that the Q is improved at low temperature. This improves the noise figure of the acoustic device.

Figure 3:
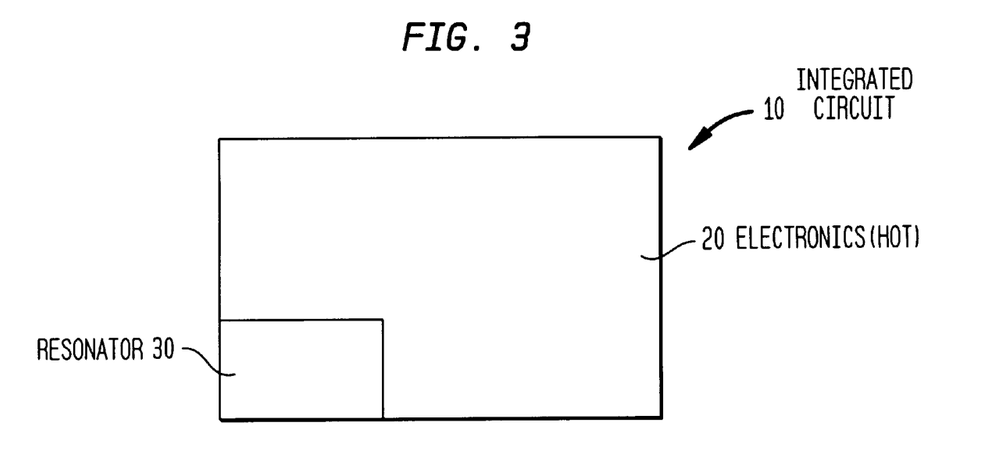
FIG. 3 shows the temperature regions of one embodiment of the invention.

FIG. 3 shows another advantage of low temperature. Often, at high device (transistor) densities, heat generation and removal are problems. By using the necessary cooling in an integrated circuit 10, we simultaneously achieve both an area 20 having adequate transistor temperatures as well as a region 30 with low enough T to provide resonator with superior Q.

At liquid nitrogen (LN) temperature (or any stable low temperature), the temperature coefficient (TC) of frequency of the GaAs (or other piezoelectric semiconductor) is unimportant, since the temperature is constant to a high degree. The temperature coefficient of frequency of GaAs is less than approximately minus 100 ppm/K at room temperature (RT); this varies somewhat with orientation, but FIG. 5A indicates the correct order of magnitude. The device 'is in a constant temperature bath' is another way of expressing the fact that the sample temperature is spatially uniform, and temporally invariant.

However, a low temperature operating environment has drawbacks. As temperature is lowered, the specific heat is lowered. This leads to increased susceptibility to microphonics. Any mechanical vibrations will cause phonon excitation. In other words, a mechanical disturbance adds energy to the system, which leads to temperature fluctuations. The amount that the temperature fluctuates is inversely proportional to the specific heat. As the specific heat decreases, temperature fluctuations caused by microphonics will increase. Cv is the specific heat, U is the internal energy of the system, and T is the temperature. Therefore:

$$Cv=dU/dT \approx \Delta U/\Delta T$$

$$\Delta T=\Delta U/Cv.$$

Figure 4:
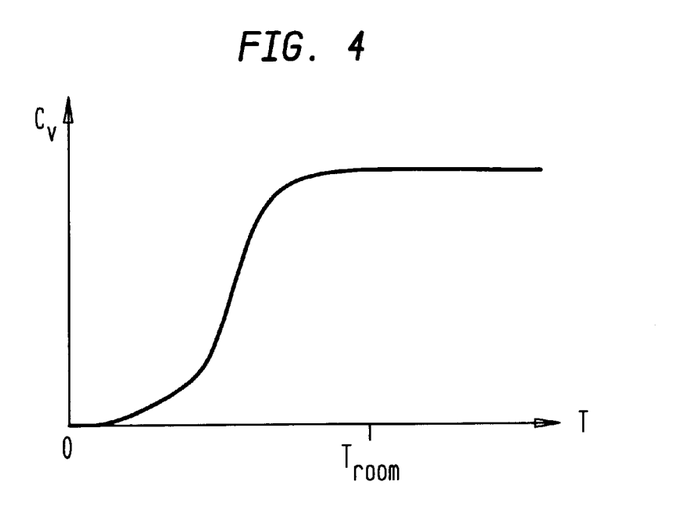
FIG. 4 shows the relationship between temperature and specific heat.

The smaller that the specific heat is, the greater the effect of a change in internal energy is to the temperature of the device, as shown in FIG. 4. The internal energy changes from a mechanical vibration such as knocking or shaking. This causes a temperature fluctuation. This fluctuation is exacerbated at low temperatures, because the, specific heat is lower at low temperatures. This effect is called microphonics.

Figure 8:
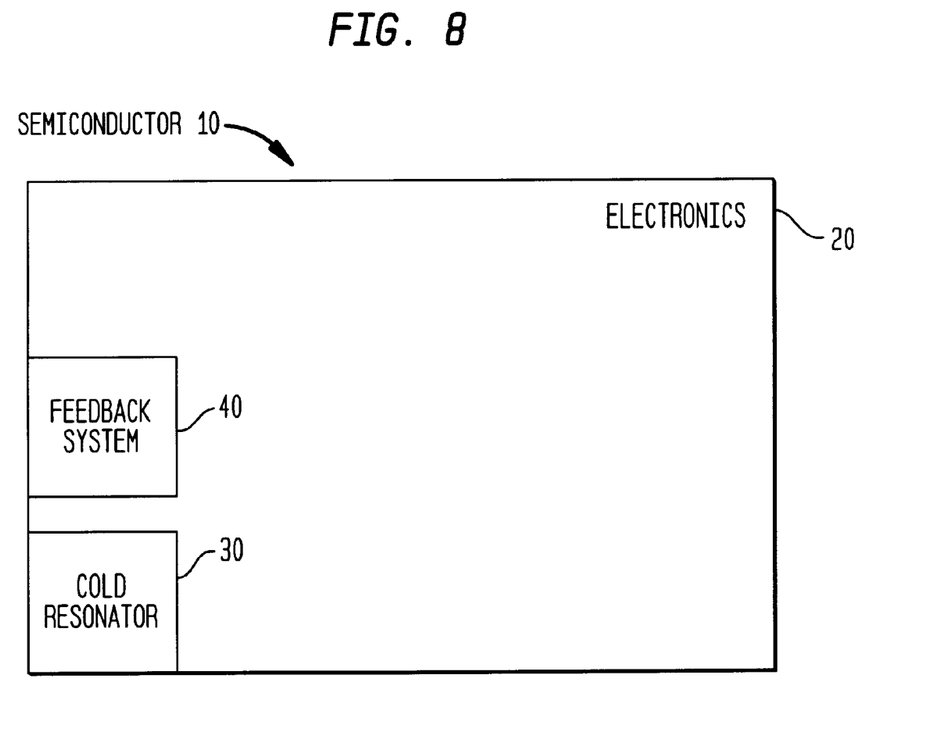
FIG. 8 shows a semiconductor chip containing electronics and acoustic device.

As a result, microelectronics are used to provide feedback to compensate for microphonics. For example, a plurality of small, auxiliary resonators or sensors detect the externally applied disturbances, via their piezoelectric effect, and provide input to microelectronic circuitry to produce signals that are merged with those of the disturbed acoustic wave device in a compensatory manner. In general, any system that is able to detect microphonics and to generate a feedback signal to the acoustic wave device so that the temperature of the acoustic wave device remains stable can be used to provide feedback to compensate for microphonics. See FIG. 8.

The ancillary electronics/microelectronics/integrated circuits (ICs), located elsewhere on the chip from the 'cold resonator' may be of any of the varieties known in the art; examples include: MESFET (metal-semiconductor field-effect transistor), HEMT (high electron mobility transistor), and HBT (heterojunction bipolar transistor).

Noise figures of both resonator and of the electronics are improved at low temperature. Close-in (meaning near the carrier frequency) phase noise of the resonator is likewise improved at low temperatures.

Uses for resonators include those cited in Sturzebecher (U.S. Pat. No. 5,801,476), namely, oscillators, filters, phase-lock loops, and clock recovery circuits; in addition, one can have signal processors and frequency synthesizers. Uses for sensors and actuators include MEMS (micro-electro-mechanical structures/systems) devices, MOMS (micro-opto-mechanical structures/systems) devices, accelerometers, tunable microwave filters, and switches.

High Temperature Aspects of Piezoelectric Acoustic Devices

Materials such as silicon carbide (SiC), gallium nitride (GaN), aluminum nitride (AlN), and boron nitride (BN), etc., are wide bandgap semiconductors. Some (e.g., alpha-SiC, GaN, AlN) are hexagonal, in crystal class 6 mm, having the wurtzite structure. Others (e.g., beta-SiC and BN) are cubic, in crystal class 4-bar 3 m, having the zincblende structure.

Figure 12:
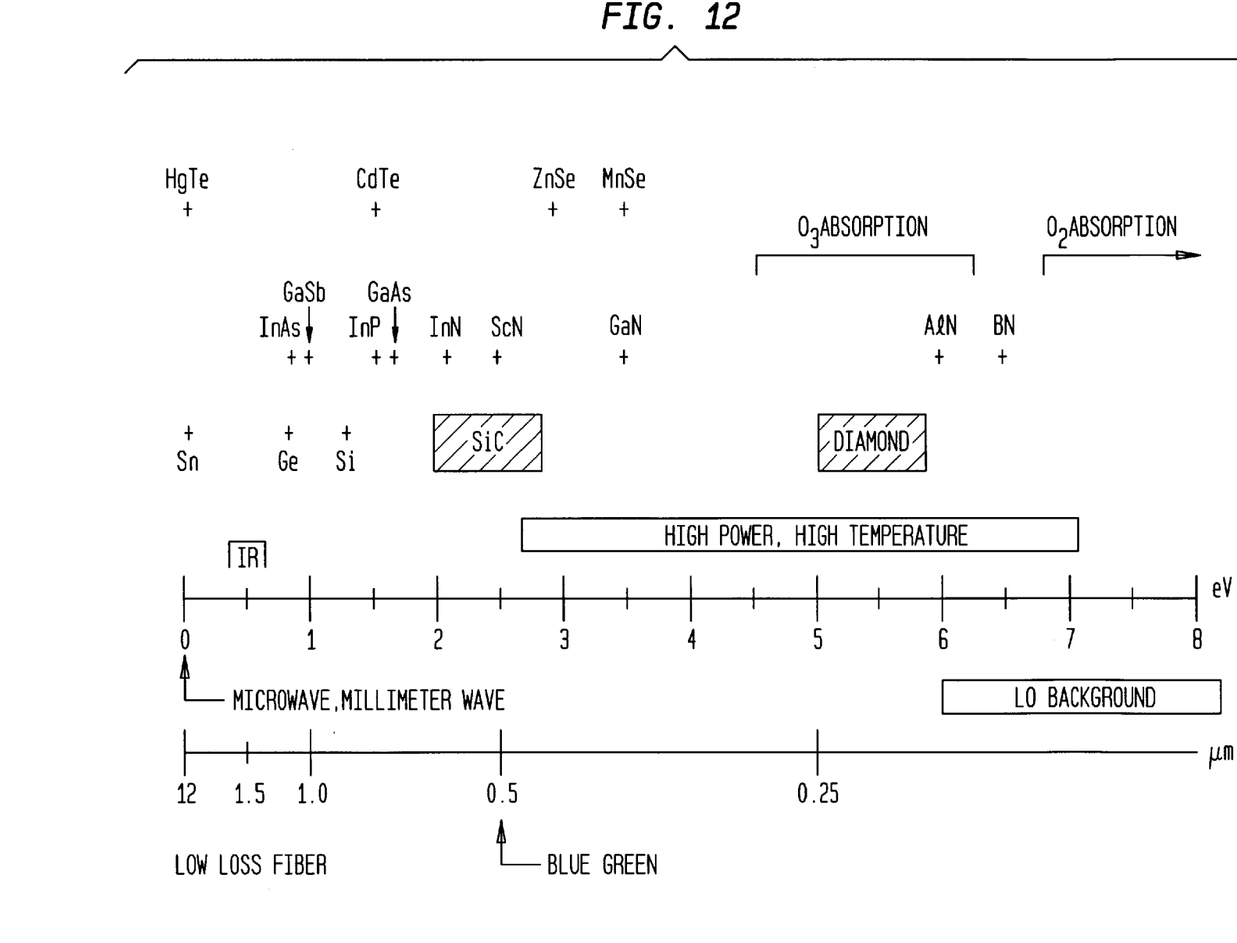
FIG. 12 shows the bandgaps (in electron-volt, abbreviated 'eV') of various semiconductors.

The term "bandgap" refers to the energy difference between the top of the valence band, and the bottom of the conduction band, as shown in FIG. 12. The size of the bandgap determines how easy or difficult it is to promote electrons (and holes) into states where they can contribute to the electrical current. A wide bandgap means that a relatively large amount of energy must be supplied to achieve conduction. Energy can be supplied by thermal means; as temperature increases, the number of conduction electrons increases. If the bandgap is not large, temperature effects can make the material very conducting. Such a state would short-circuit the piezoelectric effect, and render devices depending upon the effect inoperable.

Wide bandgap materials retain the usefulness of the piezoelectric effect to much higher temperatures. The general features seen in FIG. 2, referring to gallium arsenide, (which has only a moderate bandgap), apply also to the wide bandgap materials, but the temperature scale is much different. Large acoustic 'Q' values are retained even in the region of very high temperatures, say, above 400 degrees celsius, 600 degrees celsius, or even much higher. Therefore, one can construct acoustic devices, integral with the electronic 'IC' that operate with high Q values in an elevated temperature range, far beyond room temperature, without recourse to cooling means.

For example, the use of silicon carbide, which is piezoelectric (6 mm crystal class), can be used as a high temperature-compatible resonator, because silicon carbide has a large bandgap, which provides a higher Q at high temperature. SiC is excitable using either thickness or lateral electric fields. Because SiC is a semiconductor, and can be used for microelectronic devices, one can make monolithic components that incorporate both mechanical motion (resonators, transducers and actuators) and electronics (resonator plus electronics equals oscillator, actuator plus electronics equals sensor) to provide truly small, inexpensive, devices and subsystems that operate over vast temperature extremes, e.g., inside engines.

High temperature monolithic frequency sources may be used as oscillators for sensors (pressure, acceleration, temperature) and filters, actuators and transducers for excitation of acoustic waves for nondestructive evaluation (NDE) applications. These high temperature sources can be used as jet engine sensors, automotive sensors and in oil well logging, because no cooling is needed for the sensors.

A thickness excitation or lateral excitation will produce a shear bulk acoustic wave (BAW), a longitudinal BAW, or a surface acoustic wave (SAW), depending on the crystal cut.

A thin film of silicon carbide on silicon or other suitable substrate, having a good lattice match and expansion coefficient, will also produce the high temperature monolithic frequency source. Silicon carbide on gallium arsenide can also be used to benefit from the semiconductor properties of gallium arsenide.

The effects on the acoustic device caused by external events such as high temperature, or acceleration, can be compensated by using feedback from electronic circuitry, similar to the microelectronic circuitry that is used to provide feedback for compensating the effects of microphonics. An example of such electronic feedback is a plurality of small, auxiliary resonators or sensors to detect the externally applied disturbances, via their piezoelectric effect and output a signal, and microelectronic circuitry for receiving the output signal from the sensors and for producing compensation signals that are merged with those of the disturbed acoustic device in a compensatory manner.

Also, a diaphragm can be used for higher performance. A thin film diaphragm resonator can operate at high frequencies, such as UHF or GHz.

Class 4-bar 3 m Material

Figure 7A:
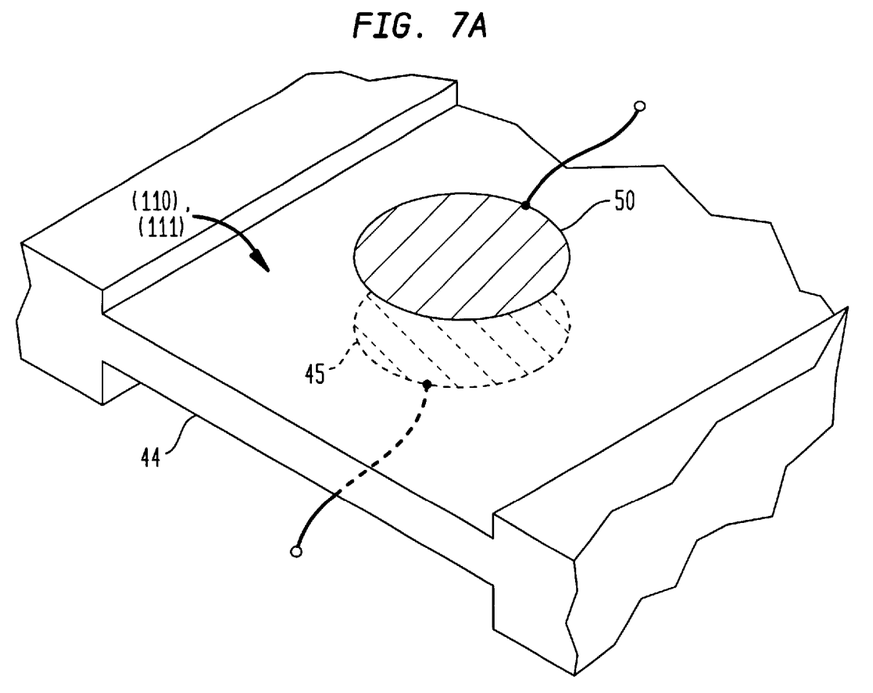
FIGS. 7A & 7B show a bulk acoustic wave embodiment of the invention.
Figure 7B:
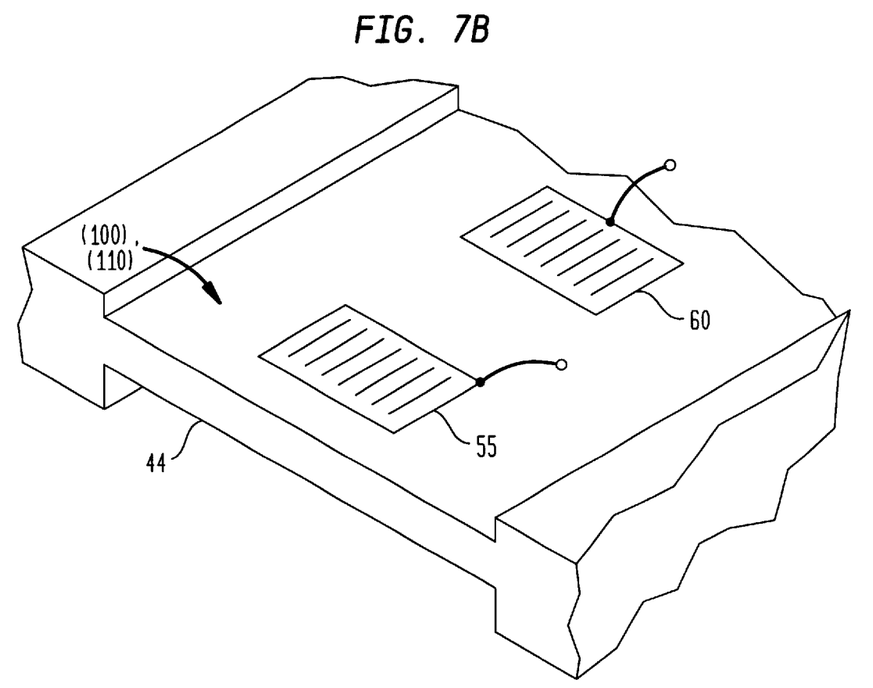

The accompanying Table 2 relates to FIG. 7, and it shows the excitation means allowed for the three principal cuts ([100], [110], and [111]) of 4-bar 3 m crystals, and the mode types excited in each case. FIG. 7A depicts thickness excitation and electrodes 45 and 50, respectively. FIG. 7B depicts a lateral field excitation and electrodes 55 and 60, respectively. The more general doubly rotated cuts will usually permit use of either thickness-excitation (TE) or lateral-excitation (LE) to drive a desired mode piezoelectrically into vibrational motion.

1. (100) cut:
   $[e'_{14}/e_{14}]$ (LE), thickness-shear with motion along $X'_3$
   $[e'_{36}/e_{14}]$ (LE), thickness-shear with motion along $X'_1$
   Effective piezoelectric constant for both is $e'_{14}=e'_{36}=e_{14}$.
2. (110) cut:
   $[e'_{32}/e_{14}]$ (LE), thickness-extension; motion along $X'_2$
   Effective piezoelectric constant is $e'_{32}=-e_{14}$.
   $[e'_{24}/e_{14}]$ (TE), thickness-shear with motion along $X'_3$
   Effective piezoelectric constant is $e'_{24}=-e_{14}$.
3. (111) cut:
   $[e'_{22}/e_{14}]$ (TE), thickness-extension; motion along $X'_2$
   Effective piezoelectric constant is $e'_{22}=-(2/\sqrt{3})\,e_{14}$.
   $[e'_{16}/e_{14}]$ (LE), thickness-shear with motion along $X'_1$
   $[e'_{34}/e_{14}]$ (LE), thickness-shear with motion along $X'_3$
   Effective piezoelectric constant for both is $e'_{16}=e'_{34}=(1/\sqrt{3})\,e_{14}$.

Table 2. Lateral and thickness field excitation of the simple thickness modes of the three principal cuts of 4-bar 3 m crystal plates. Plate thickness is along the $X'_2$ axis.

Class 6 mm Material

The following is a synopsis of behavior of simple thickness modes in plates of hexagonal class 6 mm material. The unique axis is taken in the [001] direction, and denoted as P. Crystals in this class do not possess 'doubly rotated' orientations; the most general situation is the 'singly rotated' case.

For P parallel to the plate normal, all modes are pure, with the shears degenerate. TE drives only the extensional mode. LE drives only the shear mode, and displacement is along the LE field direction.

For P in the plane of the plate, all three modes are pure, with one shear mode having displacement along P, and the other having displacement in the plane, but normal to P. TE drives only the shear mode having motion along P. LE drives only the extensional mode, providing there is a component of $E_{lateral}$ along P.

When the unique axis P is neither parallel nor perpendicular to the plate normal, one shear mode remains pure, and inert to TE (polarized perpendicular to both P and to the plate normal). It may be either the fast or slow shear mode, depending on the material and angle. The other two modes are coupled, and TE drives both. All three modes, the pure shear and the two coupled modes, are driven by LE if $E_{lateral}$ is neither normal nor parallel to P', the projection of P in the plane of the plate. If $E_{lateral}$ is normal to P', only the pure shear mode, polarized normal to P', (and therefore along $E_{lateral}$), is driven by LE. If $E_{lateral}$ is parallel to P', only the two coupled modes are driven by LE, (since they both have components of displacement along $E_{lateral}$), and the motions are normal to that of the inert pure shear mode, i.e., in the plane containing P' and the plate normal.

Doubly Rotated Orientations

Figure 9:
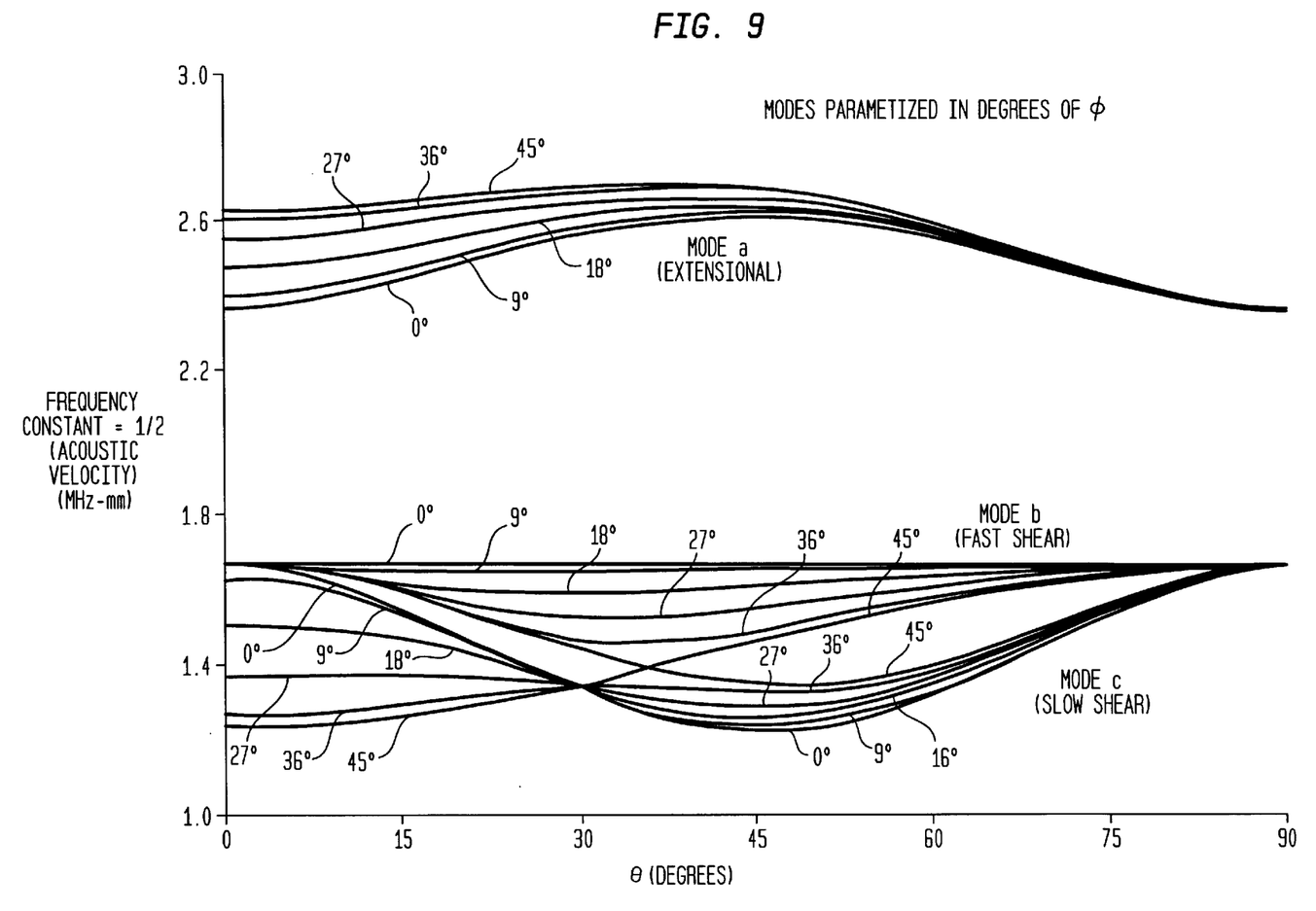
FIG. 9 shows the frequency constants of doubly rotated cuts of gallium arsenide.
Figure 10:
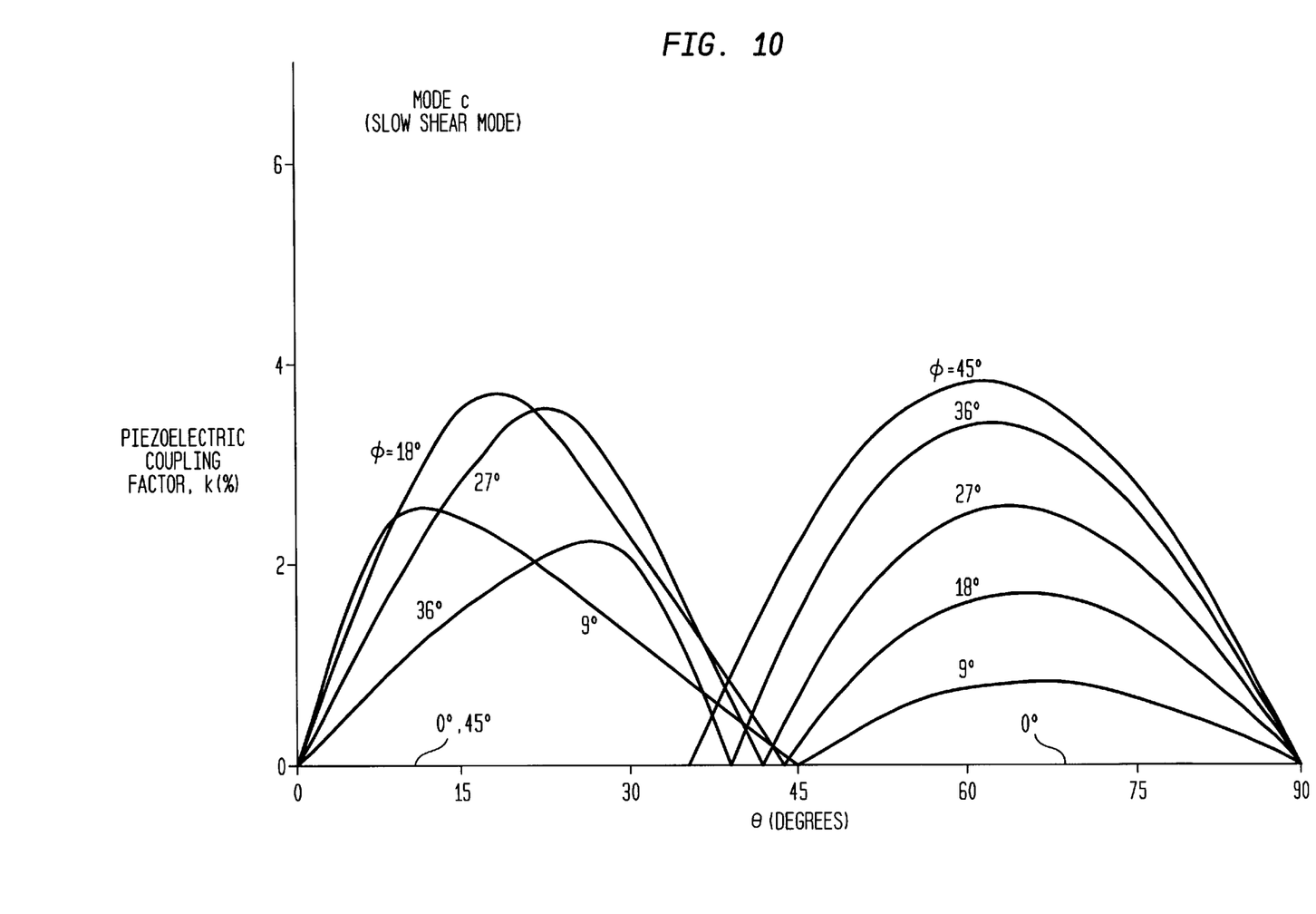
FIG. 10 shows the thickness excitation piezoelectric coupling factors of doubly rotated cuts of gallium arsenide.
Figure 11:
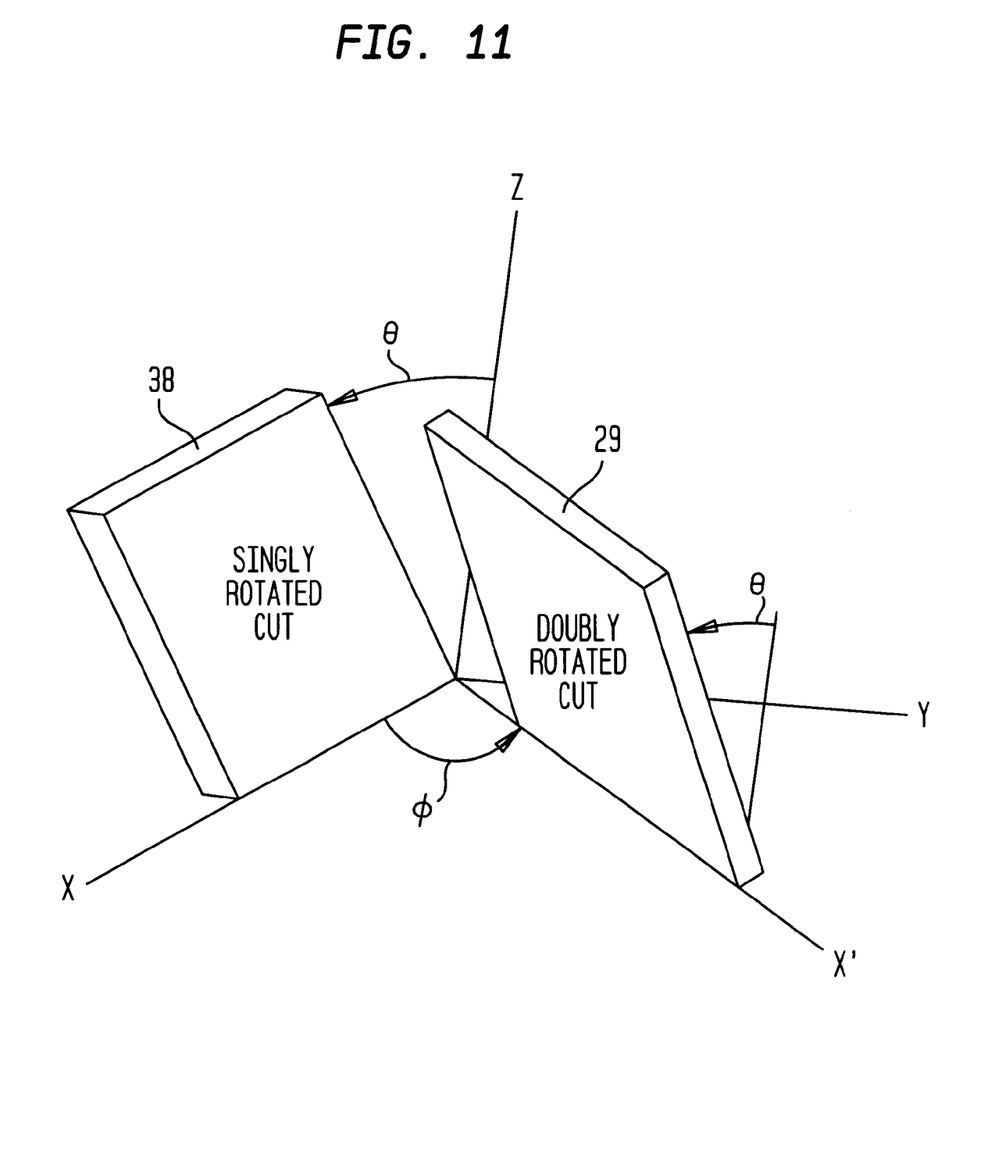
FIG. 11 shows doubly rotated cuts of crystals.

The curves in FIG. 9 show a remarkable feature in the vicinity of the doubly rotated orientations where angle θ0 equals approximately 28 or 29 degrees. In this region, the slow-shear mode is virtually insensitive to the orientation angle Φ. The corresponding TE coupling factors are given in FIG. 10; they disclose that, provided Φ is neither 0° nor 45°, the mode may be excited by a thickness-directed electric field. The acoustic properties are not sensitive to manufacturing deviations in angle Φ in this region.

The IEEE standard for describing the doubly rotated cuts of orientation expressed in terms of the angles ϕ and θ is given as:

$$(YXwl)(\Phi)/(\Theta)$$

FIG. 9 gives the frequency constants Nm versus Θ for various Φ values. Interestingly, the behavior of the c mode is between 28.78 degrees and 29.79 degrees, where the value of Nc is virtually independent of Φ.

Proposed Implementations

The present invention can use [100], [110], or [111] orientations of 4-bar 3 m crystals, or, indeed any of the infinitude of doubly rotated cuts of 6 mm or 4-bar 3 m crystals as may be now or in the future be found to be technologically of value. Use of other orientations often permits one a choice of excitation means, either thickness excitation or lateral excitation. Both thickness extensional and shear modes may be driven into vibration piezoelectrically. The compounds used may be simple binary compounds, such as gallium arsenide, as well as ternary alloys, such as AlGaAs, and also quaternary compounds, such as InGaAsP, for example.

Both surface and bulk acoustic wave monolithic frequency control components are of interest. Bulk acoustic wave components require two-side wafer processing for the construction of thin diaphragms, while surface acoustic wave components require only one-side wafer processing.

Monolithic Surface Acoustic Wave (SAW) Circuits

Figure 6A:
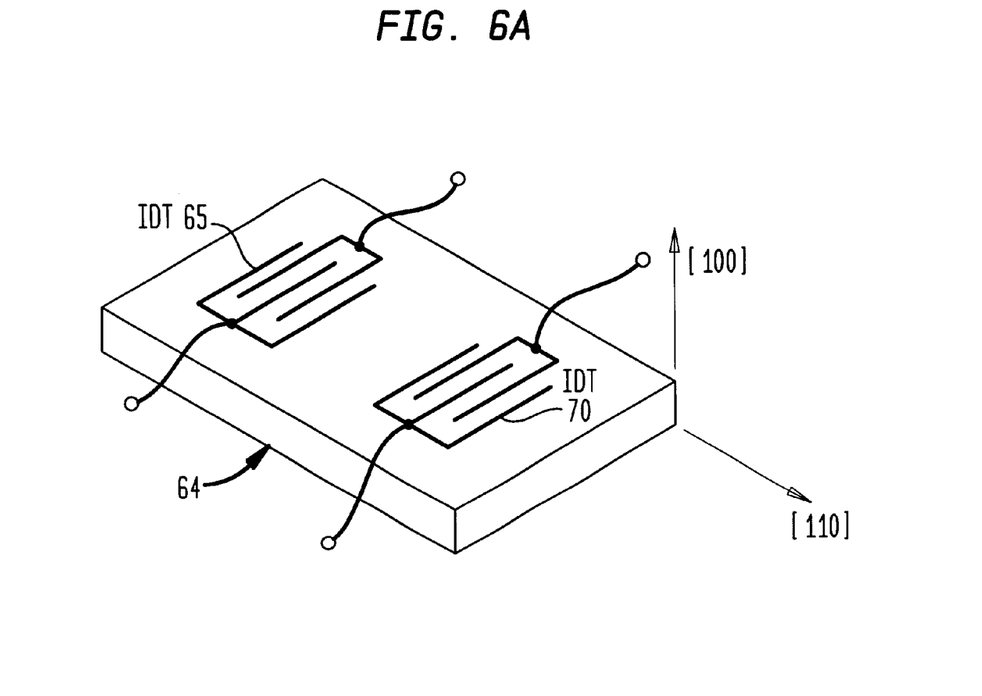
FIGS. 6A & 6B show a surface acoustic wave embodiment of the invention.

FIG. 6 shows a surface acoustic wave embodiment of the present invention. In FIG. 6A, surface acoustic wave device 64 has interdigital transducers (IDT's) 65 and 70 fabricated on [100] surface normals with [110] propagation direction. The surface acoustic wave velocity and piezoelectric coupling for gallium arsenide for this orientation are similar to ST Quartz. The use use of gallium arsenide, or other III–V material combinations, are known to theoretically improve the piezoelectric constant relative to gallium arsenide alone, and may have advantages over pure gallium arsenide devices. Such materials are readily grown by molecular beam epitaxy or organo-metallic chemical vapor deposition on gallium arsenide substrates.

Figure 6B:
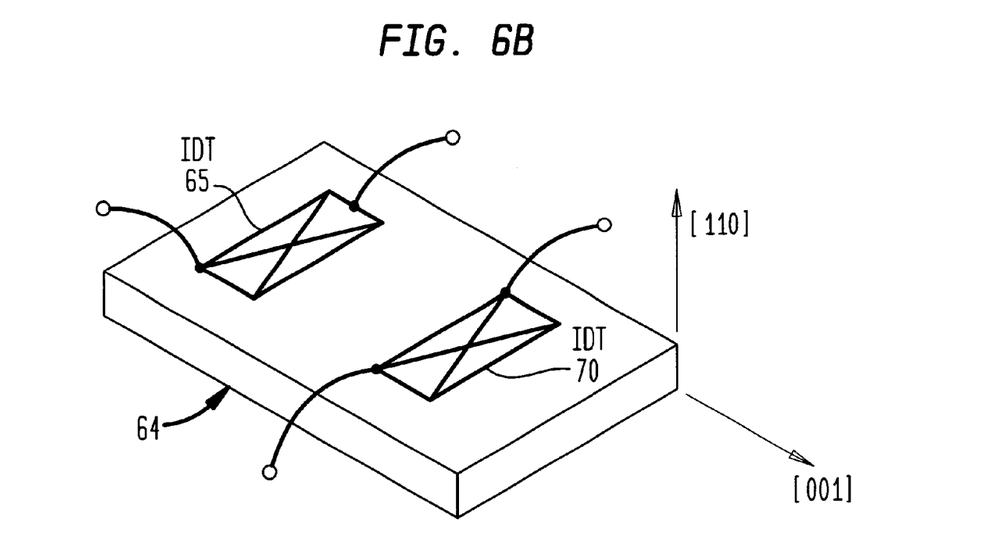

Another orientation is depicted in FIG. 6B with [110] surface normal and [001] propagation direction results in a surface shear wave having greater piezoelectric coupling. Normally, the surface normal for substrates used for gallium arsenide integrated circuitry have the [100] surface normal, so that surface acoustic wave devices may be preferred over surface shear wave devices. Surface acoustic wave resonator components have been fabricated with loaded Q near 12,000 at 180 MHz. New data have been obtained showing the increase in Q at low temperatures, as shown in FIG. 2, and given in the following Table 3.

| Temperature, T (° C.) | Frequency, f (MHz) | Quality factor, Q |
|---|---|---|
| +21 | 119.0 | 5,650 |
| −70 | 119.4 | 7,210 |
| −99 | 119.6 | 8,500 |
| −176 | 120.0 | 10,970 |

Table 3 contains the experimental data from which FIG. 2 is plotted.

Monolithic Bulk Acoustic Wave Circuits

FIG. 7 shows a bulk acoustic wave embodiment of the present invention. Bulk acoustic wave thin diaphragm resonators and coupled resonator filters may be fabricated on (100), (110) and (111) oriented substrates.

The [100] and [110] surface normal would utilize transverse electric coupling to the shear wave resonant between upper and lower surfaces of a thin diaphragm 44, as shown in FIG. 7B. Suitable layers of GaAs or similar material may be used as etch stops for diaphragm formation. Shear wave excitation at the planar surface is accomplished using lateral field excitation, for example using electrodes 55 and 60.

The [110] and [111] surface normal orientations would make use of bulk wave excitation between top and bottom surfaces of a thin diaphragm 44 using electrodes 45 and 50 disposed on the major plate surfaces as shown in FIG. 7A.

It is to be understood that such other features and modifications to the foregoing detailed description are within the contemplation of the invention, which is not limited by this description. As will be further appreciated by those skilled in the art, any number of configurations of resonators, as well any number of combinations of circuits and differing materials and dimensions can achieve the results described herein. Accordingly, the present invention should not be limited by the foregoing description, but only by the appended claims.

What is claimed is:

1. An article of manufacture to compensate for semiconductor microphonics, comprising:
    an integrated circuit;
    an acoustic device fabricated in the integrated circuit;
    the acoustic device being a piezoelectric semiconductor;
    a heat sink means provides cryogenic temperature stability to the acoustic device; and
    the integrated circuit includes a means for generating electronic feedback, having a plurality of sensors, that generates electronic feedback to the acoustic device to compensate for microphonics resulting in an improved Q factor of at least 5,000 from 30.0 MHz to 300.0 MHz.

2. The article of claim 1, further comprising the piezoelectric semiconductor is a III–V or a II–VI semiconductor.

3. The article of claim 2 wherein the III–V or II–VI semiconductor is a binary, ternary, or quaternary alloy.

4. The article of claim 1, further comprising the piezoelectric semiconductor is of crystallographic point group 4-bar 3 m or 6 mm.

5. The article of claim 4 wherein:
    the piezoelectric semiconductor has an orientation selected from the group comprising:
    [100], [110], [111], or doubly rotated cuts.

6. The article of claim 1, further comprising the piezoelectric semiconductor has doubly roatated orientations where the acoustic velocity of the mode of operation is substantially independent of deviations in angles Φ and θ.

7. The article of claim 6, wherein the cuts of the doubly rotated orientations are largely insensitive to manufacturing deviations.

8. The article of claim 6, wherein Φ is greater than zero degrees and less than 45 degrees.

9. The article of claim 6, wherein θ is greater than 25 degrees and less than 35 degrees.

10. The article of claim 5, further comprising, the heat sink means is a thermoelectric cooler.

11. The article of claim 5, further comprising, the piezoelectric semiconductor is a GaAs semiconductor.

12. The article of claim 5, further comprising, the band gap of the semiconductor is larger than 1.4 eV.

13. The article of claim 5, further comprising the heat sink means is liquid nitrogen.

14. The article of claim 5, further comprising a temperature-stable monolithic integrated circuit device.

15. A temperature-stable monolithic integrated circuit device, comprising:
a monolithic, integrated circuit, semiconductor including a piezoelectronic semiconductor functioning as an acoustic device;
a heat sink means;
a means for electronic feedback to said piezoelectronic semiconductor generates a feedback signal to said piezoelectronic semiconductor;
said heat sink means provides a cryogenic temperature stability to maintain a constant temperature to compensate for microphonics;
a signal means for carrying a signal that excites the device; and
said constant temperature provides an improved Q factor of at least 5,000 from 30.0 MHz to 300.0 MHz.

16. The device of claim 15, further comprising:
the acoustic device is a bulk acoustic thin diaphragm wave resonator; and a plurality of coupled resonator filters being fabricated on a substrate.

17. The device of claim 15, further comprising:
the acoustic device is a surface acoustic wave resonator;
said surface acoustic wave resonator being constructed of gallium arsenide; and
said surface acoustic wave resonator having a plurality of interdigital transducers.

18. The device of claim 15, wherein
the acoustic device is a cantilever actuator.

19. The device circuit of claim 15, wherein the acoustic device is operated non-resonantly.

20. A device comprising:
a semiconductor;
a piezoelectric resonator located in the semiconductor;
a heat sink means provides a constant temperature for said resonator;
a means for generating electronic feedback, having a plurality of sensors, located on the semiconductor generates feedback to the resonator to compensate for microphonic disturbances;
said semiconductor, and said heat sink means being combined to form a monolithic integrated circuit; and
said constant temperature results in an improved Q factor of at least 5,000 from 30.0 MHz to 300.0 MHz.

21. A microphonic feedback system for providing feedback to a piezoelectric resonator to compensate for energy from a plurality of mechanical disturbances from an acoustic device, comprising:
said piezoelectric resonator being located in a semiconductor having a heat sink means that provides a cryogenic temperature stability to said system;
a plurality of sensors detect said energy from said plurality of mechanical disturbances, via their piezoelectric effect;
said plurality of sensors providing an input to a means for generating electronic feedback; and
said feedback means produces a plurality of drive signals that are merged with a plurality of device signals sent to the acoustic device in a compensatory manner.

22. The article of claim 1, wherein the acuostic device has a band gap that is large enough for the device to operate at high temperatures.

23. The article of claim 22, wherein the bandgap is larger than 1.5 eV.

24. The article of claim 22, wherein the acoustic device comprises a piezoelectric semiconductor.

25. The article of claim 24, wherein the piezoelectric semiconductor is silicon carbide.

26. The article of claim 22, further comprising the feedback means generating feedback to the acoustic device to compensate for temperature effects.

27. The article of claim 22, further comprising the feedback means generating feedback to the acoustic device to compensate for acceleration effects.

28. The article of claim 5, further comprising a temperature-sensitive monolithic integrated circuit device.

29. The article of claim 10, further comprising a monolithic integrated circuit device operating at high temperatures.

30. The article of claim 10, further comprising a monolithic integrated circuit device operating at low temperatures.

31. The temperature-stable monolithic integrated circuit device, as recited in claim 16, further comprising:
said bulk acoustic wave resonator being fabricated on a 100 and a 110 surface normal; and
said 100 and 110 surface normal utilizing transverse electric coupling to a shear wave resonant between an upper surface and a lower surface of said thin diaphragm wave resonator.

32. The temperature-stable monolithic integrated circuit device, as recited in claim 31, further comprising:
a plurality of GaAs layers as etch stops for diaphragm formation; and
a plurality of electrodes.

33. The temperature-stable monolithic integrated circuit device, as recited in claim 32, further comprising said heat sink means providing cryogenic temperature stability to the piezoelectric semiconductor.

34. The temperature-stable monolithic integrated circuit device, as recited in claim 33, further comprising said heat sink means being a thermoelectric cooler.

35. The temperature-stable monolithic integrated circuit device, as recited in claim 34, further comprising a shear wave excitation at a planar surface using lateral field excitation with said plurality of electrodes.

36. The microphonic feedback system for providing feedback to a piezoelectric resonator to compensate for energy from mechanical disturbances, as recited in claim 21, said plurality of sensors further comprising at least one temperature-sensitive monolithic integrated circuit device.

37. The microphonic feedback system for providing feedback to a piezoelectric resonator to compensate for energy from mechanical disturbances, as recited in claim 36, said temperature-sensitive monolithic integrated circuit device, further comprising:
a monolithic, integrated circuit, semiconductor having a piezoelectronic semiconductor functioning as an acoustic device;

a heat sink means;

a means for electronic feedback to said piezoelectronic semiconductor generates a feedback signal to said piezoelectronic semiconductor;

said heat sink means provides a cryogenic temperature stability to maintain a constant temperature to compensate for microphonics;

a signal means for carrying a signal that excites the device; and said constant temperature provides an improved Q factor of at least 5,000 from 30.0 MHz to 300.0 MHz.

38. The temperature-sensitive monolithic integrated circuit device recited in claim 36, further comprising:

a monolithic, integrated circuit, semiconductor including a piezoelectronic semiconductor functioning as an acoustic device;

a heat sink means;

a means for electronic feedback to said piezoelectronic semiconductor generates a feedback signal to said piezoelectronic semiconductor;

said heat sink means provides a cryogenic temperature stability to maintain a constant temperature to compensate for microphonics;

a signal means for carrying a signal that excites the device; and said constant temperature provides an improved Q factor of at least 5,000 from 30.0 MHz to 300.0 MHz.

39. The temperature-sensitive monolithic integrated circuit device, as recited in claim 38, further comprising:

the acoustic device is a bulk acoustic thin diaphragm wave resonator; and a plurality of coupled resonator filters being fabricated on a substrate.

40. The temperature-sensitive monolithic integrated circuit device, as recited in claim 39, said further comprising:

said bulk acoustic wave resonator being fabricated on a 100 and a 110 surface normal; and said 100 and 110 surface normal utilizing transverse electric coupling to a shear wave resonant between an upper surface and a lower surface of said thin diaphragm wave resonator.

41. The temperature-sensitive monolithic integrated circuit device, as recited in claim 40, further comprising:

a plurality of GaAs layers as etch stops for diaphragm formation; and a plurality of electrodes.

42. The temperature-sensitive monolithic integrated circuit device, as recited in claim 41, further comprising said heat sink means being a thermoelectric cooler.

43. The temperature-sensitive monolithic integrated circuit device, as recited in claim 41, further comprising said heat sink means being liquid nitrogen.

44. The temperature-sensitive monolithic integrated circuit device, as recited in claim 43, further comprising a shear wave excitation at a planar surface using lateral field excitation with said plurality of electrodes.

45. The microphonic feedback system for providing feedback to a piezoelectric resonator to compensate for energy from mechanical disturbances, as recited in claim 37, said temperature-sensitive monolithic integrated circuit device further comprising:

the acoustic device is a bulk acoustic thin diaphragm wave resonator; and a plurality of coupled resonator filters being fabricated on a substrate.

46. The microphonic feedback system for providing feedback to a piezoelectric resonator to compensate for energy from mechanical disturbances, as recited in claim 45, said temperature-sensitive monolithic integrated circuit device further comprising:

said bulk acoustic wave resonator being fabricated on a 100 and a 110 surface normal; and said 100 and 110 surface normal utilizing transverse electric coupling to a shear wave resonant between an upper surface and a lower surface of said thin diaphragm wave resonator.

47. The microphonic feedback system for providing feedback to a piezoelectric resonator to compensate for energy from mechanical disturbances, as recited in claim 46, said temperature-sensitive monolithic integrated circuit device further comprising:

a plurality of GaAs layers as etch stops for diaphragm formation; and a plurality of electrodes.

48. The microphonic feedback system for providing feedback to a piezoelectric resonator to compensate for energy from mechanical disturbances, as recited in claim 47, said temperature-sensitive monolithic integrated circuit device, further comprising said heat sink means being a thermoelectric cooler.

49. The microphonic feedback system for providing feedback to a piezoelectric resonator to compensate for energy from mechanical disturbances, as recited in claim 47, said temperature-sensitive monolithic integrated circuit device, further comprising said heat sink means being liquid nitrogen.

50. The microphonic feedback system for providing feedback to a piezoelectric resonator to compensate for energy from mechanical disturbances, as recited in claim 49, said temperature-sensitive monolithic integrated circuit device further comprising a shear wave excitation at a planar surface using lateral field excitation with said plurality of electrodes.

51. The microphonic feedback system for providing feedback to a piezoelectric resonator to compensate for energy from mechanical disturbances, as recited in claim 21, further comprising said plurality of sensors being a plurality of resonators.

52. The microphonic feedback system for providing feedback to a piezoelectric resonator to compensate for energy from mechanical disturbances, as recited in claim 51, further comprising said plurality of resonators being a plurality of small, auxiliary resonators.

53. The article of claim 5, further comprising said heat sink means being a group of cold fingers.

* * * * *